(12) United States Patent
Ding et al.

(10) Patent No.: US 7,045,868 B2
(45) Date of Patent: May 16, 2006

(54) WAFER-LEVEL SEALED MICRODEVICE HAVING TRENCH ISOLATION AND METHODS FOR MAKING THE SAME

(75) Inventors: Xiaoyi Ding, Lake Zurich, IL (US); John P. Schuster, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/631,604

(22) Filed: Jul. 31, 2003

(65) Prior Publication Data
US 2005/0023629 A1  Feb. 3, 2005

(51) Int. Cl.
*H01L 27/14* (2006.01)
*H01I 21/00* (2006.01)

(52) U.S. Cl. .................. 257/414; 257/433; 257/459; 257/704; 257/709

(58) Field of Classification Search ............. 257/414, 257/433, 459, 704, 709
See application file for complete search history.

(56) References Cited

U.S. PATENT DOCUMENTS

| | | | |
|---|---|---|---|
| 4,541,003 A * | 9/1985 | Otsuka et al. | 257/660 |
| 4,769,345 A * | 9/1988 | Butt et al. | 29/827 |
| 4,771,214 A | 9/1988 | Takenaka et al. | |

(Continued)

FOREIGN PATENT DOCUMENTS

EP 0 851 492 A2 7/1998

(Continued)

OTHER PUBLICATIONS

Anderson, R. et al. "Investigation of Porous Silicon Vapor Sensing" *Sensors and Actuators*; A21-A23- 1990, pp., 835-839.

(Continued)

*Primary Examiner*—Nathan J. Flynn
*Assistant Examiner*—Ahmed N. Sefer
(74) *Attorney, Agent, or Firm*—Thomas V. Miller; Brian M. Mancini

(57) ABSTRACT

A microdevice (20) having a hermetically sealed cavity (22) to house a microstructure (26). The microdevice (20) comprises a substrate (30), a cap (40), an isolation layer (70), at least one conductive island (60), and an isolation trench (50). The substrate (30) has a top side (32) with a plurality of conductive traces (36) formed thereon. The conductive traces (36) provide electrical connection to the microstructure (26). The cap (40) has a base portion (42) and a sidewall (44). The sidewall (44) extends outwardly from the base portion (42) to define a recess (46) in the cap (40). The isolation layer (70) is attached between the sidewall (44) of the cap (40) and the plurality of conductive traces (36). The conductive island (60) is attached to at least one of the plurality of conductive traces (36). The isolation trench (50) is positioned between the cap (40) and the conductive island (60) and may be unfilled or at least partially filled with an electrically isolating material. There is also a method of making the same microdevice. sidewall (44) extends outwardly from the base portion (42) to define a recess (46) in the cap (40). The isolation layer (70) is attached between the sidewall (44) of the cap (40) and the plurality of conductive traces (36). The conductive island (60) is attached to at least one of the plurality of conductive traces (36). The isolation trench (50) is positioned between the cap (40) and the conductive island (60) and may be unfilled or at least partially filled with an electrically isolating material. There is also a method of making the same microdevice.

20 Claims, 7 Drawing Sheets

U.S. PATENT DOCUMENTS

| | | | |
|---|---|---|---|
| 4,875,134 A | | 10/1989 | Kuisma |
| 5,610,431 A | | 3/1997 | Martin |
| 5,614,785 A | | 3/1997 | Wallace et al. |
| 5,650,568 A | | 7/1997 | Greiff et al. |
| 5,837,562 A | | 11/1998 | Cho |
| 6,225,145 B1 | | 5/2001 | Choi et al. |
| 6,277,666 B1 | | 8/2001 | Hays et al. |
| 6,323,550 B1 | | 11/2001 | Martin et al. |
| 6,338,284 B1 | | 1/2002 | Najafi et al. |
| 6,777,263 B1 | * | 8/2004 | Gan et al. .................. 438/106 |
| 6,806,557 B1 | * | 10/2004 | Ding .......................... 257/659 |
| 2004/0077117 A1 | * | 4/2004 | Ding et al. .................. 438/51 |
| 2005/0017313 A1 | * | 1/2005 | Wan ........................... 257/415 |

FOREIGN PATENT DOCUMENTS

| | | | |
|---|---|---|---|
| EP | 1 167 281 A2 | | 1/2002 |
| JP | 200-2270366 | * | 9/2002 |
| WO | WO 200242716 | * | 5/2002 |

OTHER PUBLICATIONS

Dresser, M.J. et al. "The Absorption and Decomposition of $NH_3$ on Si(100) Detection of the $NH_2$(a) Species." *Surface Science*; 1989, pp. 75-89.

Dillon, A.C. et al. "Diethylsilane Decomposition on Silicon Surfaces Studied Using Transmission FTIR Spectroscopy." *J.Electrochemical Society*; vol. 139, No. 2, Feb. 1992, pp. 537-541.

Robinson, M.B. et al. "Porous Silicon Photoluminescence Versus HF Etching: No Correlation with Surface Hydrogen Species." *American Institute of Physics*; Mar. 1993, pp., 1493-1495.

Collins, R.T. et al. "Photoinduced Hydrogen Loss From Porous Silicon." *American Institute of Physics*; Oct. 1992, pp., 1649-11651.

Takahagi, T. et al. "Control of the Chemical Reactivity of a Silicon Single-Crystal Surface Using the Chemical Modification Technique." *American Institute of Physics*; Sep. 1990, pp., 2187-2191.

Cheng, C.C. et al. "Direct Determination of Absolute Monoslayer Coverages of Chemisorbed $C_2H_2$ and $C_2H_4$ on Si(100)." *American Institute of Physics*; Apr. 1992, pp. 3693-3699.

Corazza, A. et al. "Vacuum Maintenance in Hermetically Sealed MEMs Packages." *SAES Getters*.

Smith, R.L. et al. "Thick Films of Silicon Nitride." *Sensors and Actuators*; A21-A23, 1990, pp. 830-834.

Petersen, K. "Silicon as a Mechanical Material." *Proceedings of the IEEE*; vol. 70, No. 5, May 1982, pp. 420-456.

Kozlowski, F. et al. "Generating a Microplasma with Porous Silicon." *Transducers*; 1995, 90-PB4.

Smith, R.L. et al. "Porous Silicon Morphologies and Formation Mechanism." *Sensors and Actuators*; A21-A23, 1990, pp. 825-829.

Smith, R.L. et al. "Porous Silicon Formation Mechanisms." *American Institute of Physics*; Apr. 1992, pp. R1-R22.

Giorgi, T.A., "An Updated Review of Getters and Gettering." *Journal of Vacuum Science Technology*; A3 (2) Mar./Apr. 1995. pp. 417-423.

Kullberg, R. "Processes and Materials for Creating and Maintaining Reliable Vacuum and Other Controlled Atmospheres in Hermetically Sealed MEMs Packages." *SAES Getters*.

Henkel, S. "Novel Gas Sensor Exploits a Property of Porous Silicon." www.sensormag.com, May 2002.

Higashi, G.S. et al. "Comparison of Si(111) Surfaces Prepared Using Aqueous Solutions of $NH_4F$ Versus HF." *American Institute of Physics*; Apr. 1991, pp. 1656-1658.

Hirashita, N. et al. "Effects of Surface Hydrogen on the Air Oxidation at Room Temperature of HF-treated Si(100) Surfaces." *American Institute of Physics*; Jan. 1990 pp. 451-453.

Higashi, G.S. et al. "Ideal Hydrogen Termination of Si(111) Surface." *American Institute of Physics*; Feb. 1990, pp. 656-658.

Gupta, P. "FTIR Studies of $H_2O$ and $D_2O$ decomposition on Porous Silicon Surfaces." *Surface Science* ; 1991, pp. 360-372.

O'Halloran, G.M. et al. "A Bulk Micromachined Humidity Sensor Based on Porous Silicon." *Transducers* 1997, pp. 563-566.

Richter, A. "Design Considerations and Performance of Adsorptive Humidity Sensors with Capacitive Readout." *Transducers*; 1993, pp. 310-313.

Henmi, H. et al, "Vacuum Packaging For Microsensors By Glass-Silicon Anodic Bonding" *Transducers*'97, p. 584-587.

Hara, T. et al. "A New Fabrication Method For Low-Pressure Package With Glass-Silicon-Glass Structure And Its Stability" *Transducers*'99, p. 1316-1319.

Fujita, T. et al. "Vacuum Sealed Silicon Bulk Micromachined Gyroscope" Transducers,99, p. 914-917.

* cited by examiner

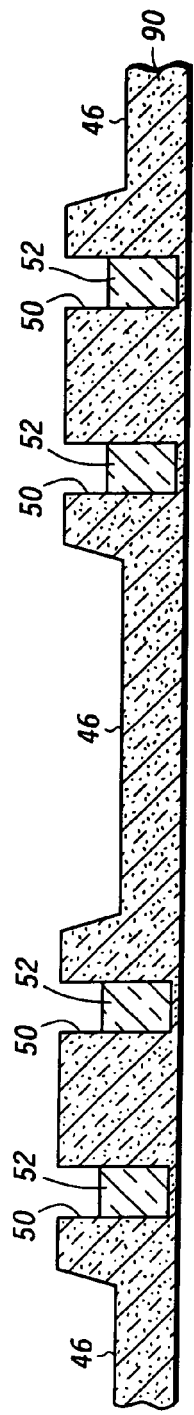
FIG. 5E
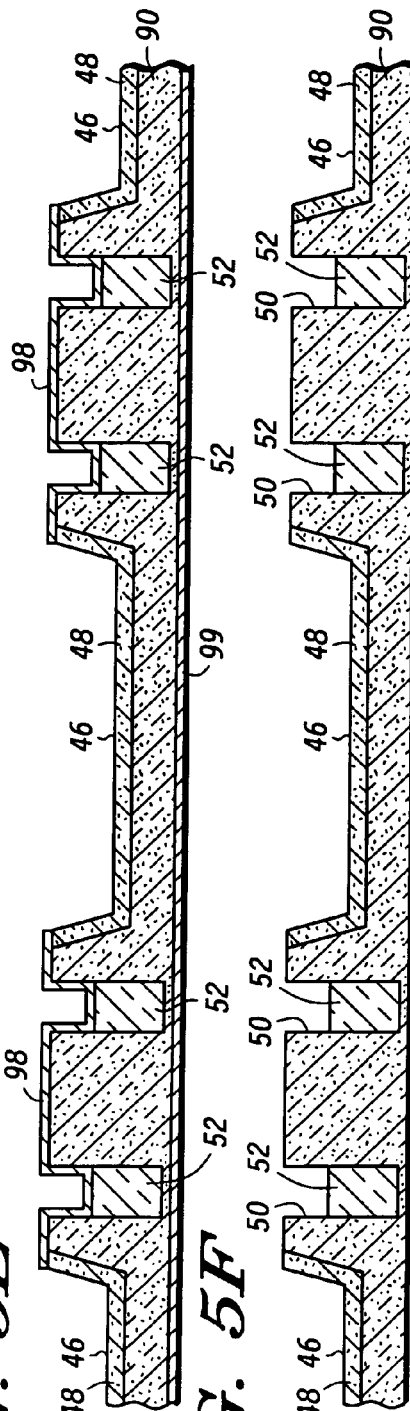
FIG. 5F
FIG. 5G
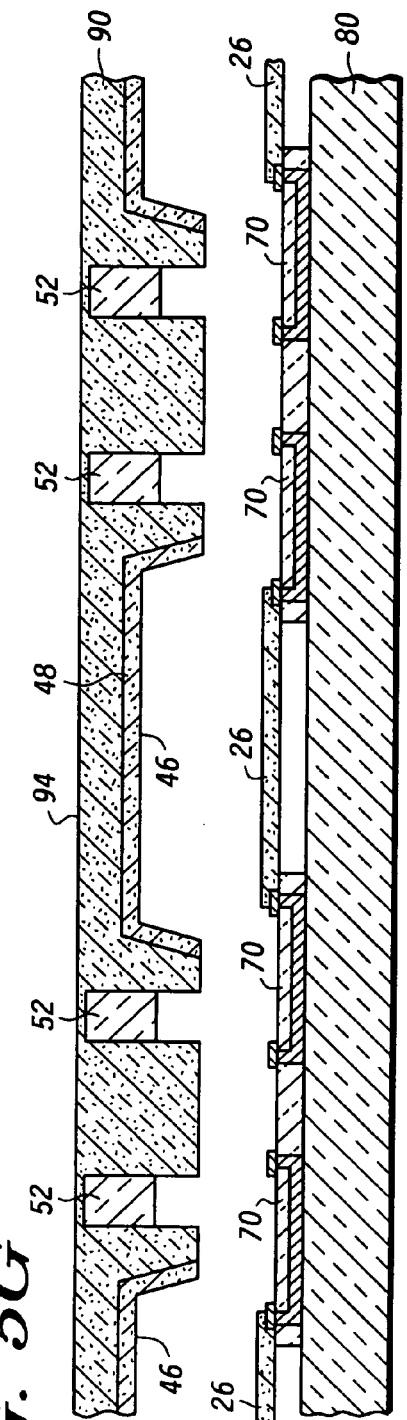
FIG. 6A

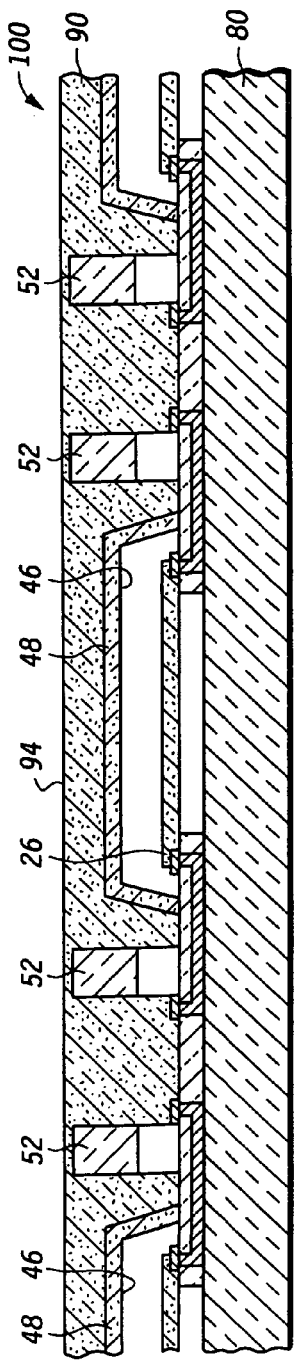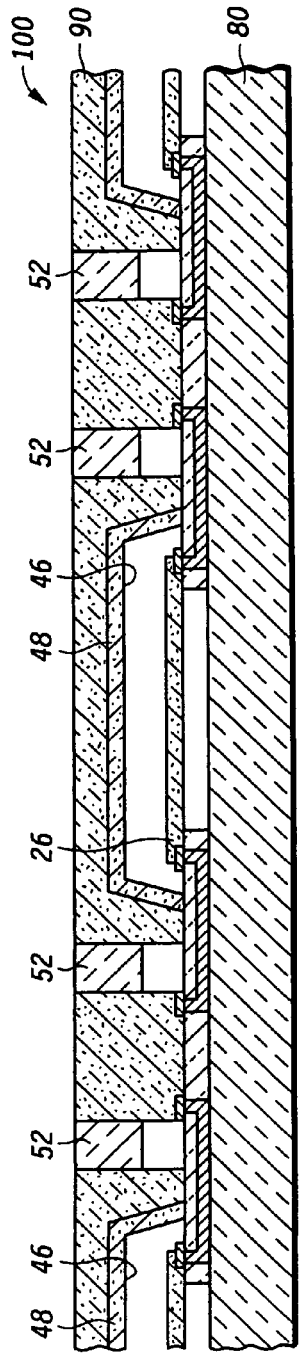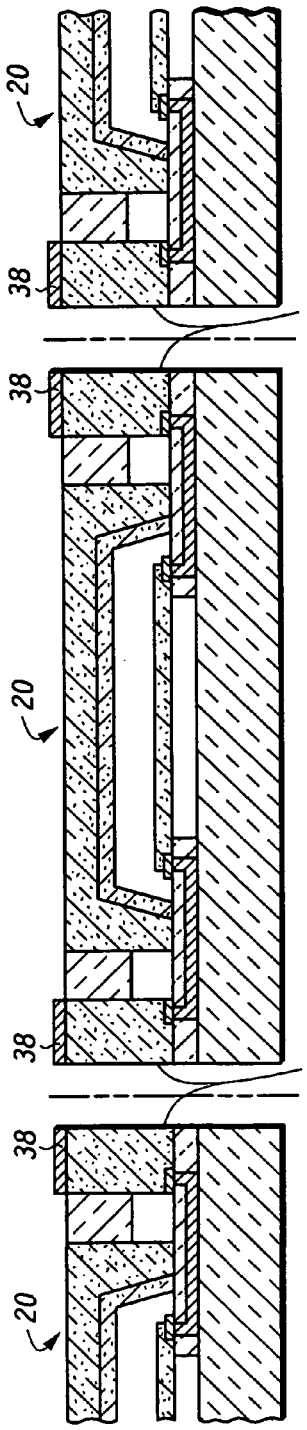

US 7,045,868 B2

WAFER-LEVEL SEALED MICRODEVICE HAVING TRENCH ISOLATION AND METHODS FOR MAKING THE SAME

FIELD OF THE INVENTION

This invention in general relates to microdevices being hermetically sealed in a vacuum cavity and, more particularly, to a design and method for electrically connecting an internal microdevice within a vacuum cavity to the outside environment through a trench isolated conductive cover wafer.

BACKGROUND OF THE INVENTION

The microdevices manufactured by MEMS technology are playing key roles in many areas. For instance, micromechanical gyroscopes have enabled several important control systems in transportation and commercial applications. Other microdevices such as pressure sensors, accelerometers, actuators and resonators fabricated by MEMS technology are also used in many areas.

Some microdevices, such as micro gyroscopes and resonators contain a microstructure that needs to be maintained within a vacuum-sealed cavity. For these types of devices, there is a continuing need to improve the methods and techniques to hermetically seal the cavity to increase device lifetime. Pressure increases due to several sources can degrade device performance and reduce device lifetime for hermetically sealed microdevices.

One source that may cause pressure to increase in the cavity of a microdevice is inadequate sealing methods and techniques. For example, a microstructure has electrodes that need to be electrically connected to the outside environment. There is a continuing need for improved feedthrough designs and hermetic seal methods to ensure a complete electrical connection and an appropriate cavity vacuum level over a device's lifetime.

For the wafer level hermetical seal, it has been known to electrically connect the electrodes of a microstructure through certain types of conductive vias formed in a wafer. This approach, however, has several disadvantages. For example, the formation of conductive vias in a wafer may result in mechanical damage to the microstructure mounted on the wafer. Additionally, vacuum degradation may occur over time due to micro cracks or other defects in the conductive via. This is especially true if the conductive via extends into the vacuum-sealed cavity that houses the microstructure. Moreover, the size of the sealed microdevice increases with the number of vias required for connecting to the microstructure.

Another source of pressure increase in the cavity of a microdevice is from gas generation during the hermetic sealing process and outgassing from the package material, sealing material, and components within the cavity. With respect to outgassing problems, it has been known to maintain a sealed vacuum within a cavity by using getters to adsorb vapor and gas species. Two different kinds of getters currently used in devices are metallic getters and non-metallic getters. It has been known to use the metallic getters in package level vacuum sealing methods. A non-metallic getter formed from organic salts of silicon for an electron tube application is described in U.S. Pat. No. 4,771,214. Another non-metallic getter formed from deposited amorphous silicon or poly-silicon for flat panel display applications is described in U.S. Pat. No. 5,614,785.

Conventional procedures have been met with varying degrees of success. For instance, with metallic getters there is a serious reliability issue caused by getter particles falling down during fabrication process or after device experiencing vibration or shock due to poor mechanical strength and too large pore size of the used metallic getter. The presence of separated getter particles has been identified as a major failure mode for some micro gyroscopes sealed with porous metallic getters. Additionally, because metallic getters typically have large pore size, the required size of the getter is normally large. This size restriction and the getter fabrication process normally prohibit many metallic getters from use in wafer level vacuum seals. Metallic getters are also cost prohibitive for some applications.

With relation to non-metallic getters, the mechanical properties of known amorphous or poly-crystalline silicon will change with deposition condition and are difficult to repeat. Known types of non-metallic getters are typically used in large sized cavities with large planar areas because of their limited thickness of only a couple of microns. Other types of getters are directed to adsorbing moisture within a cavity that is not perfectly hermetic.

It is, therefore, desirable to provide an improved microdevice having a microstructure residing in a hermetically sealed cavity of the microdevice and methods of making the same to overcome most, if not all, of the preceding problems.

BRIEF DESCRIPTION OF THE DRAWINGS

FIGS. 5A–5G are cross-sectional views of one embodiment of a method to form a cap portion of the microdevice shown in FIGS. 1–2;

FIGS. 6A–6D are cross-sectional views of one embodiment of a method to assemble the microdevice shown in FIGS. 1–2 using the substrate portion and the cap portion formed in FIGS. 4A–4E and 5A–5G;

Figure 1:
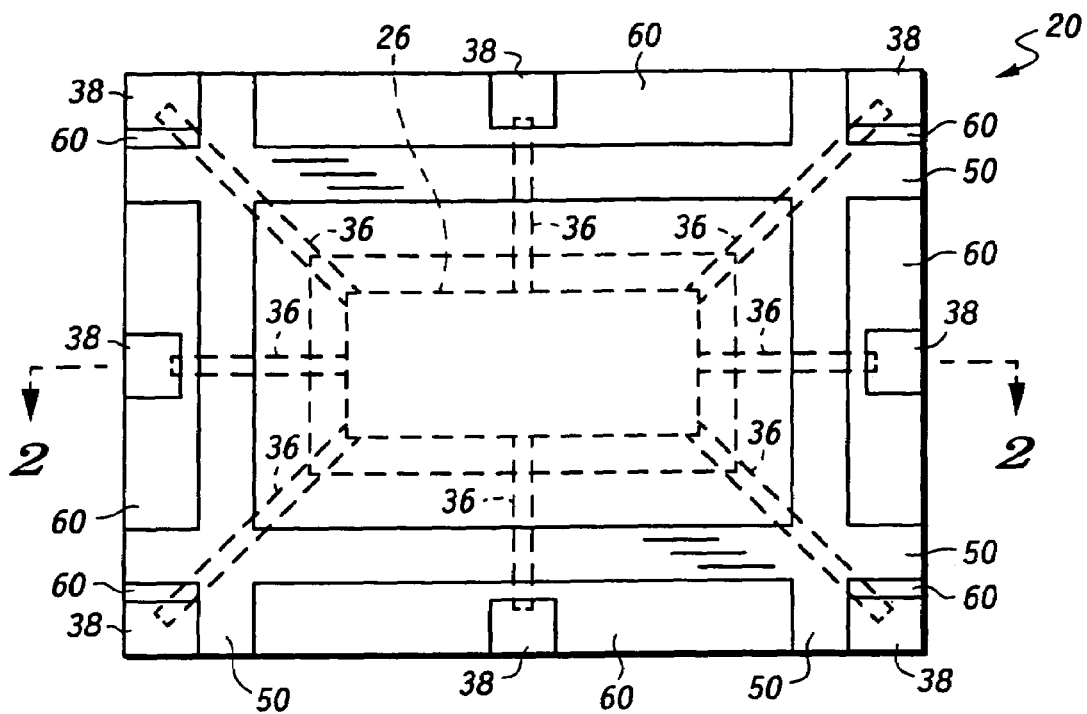
FIG. 1 is a top view of one embodiment of a microdevice having conductive feedthroughs for electrically connecting a microstructure within the microdevice to the outside environment.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a microdevice having isolation trenches and conductive feedthroughs for electrically connecting a sealed microstructure in the microdevice to the outside environment and methods of making the same. For purposes of illustration and description, an example of a micro gyroscope will be used. However, the present invention is not limited to the making and handling of micro gyroscopes but may also apply to other microdevices and structures that need to be maintained within a vacuum cavity. One of ordinary skill in the art having the benefit of this disclosure will realize that the devices and procedures described herein for making such devices could be used in other applications.

To this end, there is a microdevice having a hermetically sealed cavity to house a microstructure. The microdevice comprises a substrate, an isolation layer, and a cap having at least one conductive island and an isolation trench. The substrate has a top side with a plurality of conductive traces formed thereon. The conductive traces provide electrical connection to the microstructure. The cap has a base portion and a sidewall. The sidewall extends outwardly from the base portion to define a recess in the cap. The isolation layer is attached between the sidewall of the cap and the plurality of conductive traces formed on the top side of the substrate. The conductive island is attached to at least one of the plurality of conductive traces. The isolation trench is positioned between the cap and the conductive island and also between two adjacent conductive islands.

The isolation trench may be unfilled or at least partially filled with an electrically isolating material, such as a glass filler material. The cap with conductive islands and isolation trenches may be made of silicon, and the substrate and the isolation layer may be made from a glass material. In one embodiment, the cap may have a single crystalline silicon getter layer embedded along its internal recess for maintaining a vacuum within the cavity. The getter layer may be flat or may be corrugated along a bottom surface of the recess of the cap.

The microdevice may also comprise a substrate, an isolation layer, and a cap having conductive islands. The substrate has a top side and at least one conductive trace formed thereon. The conductive trace has a first end and a second end. The isolation layer is positioned around at least a portion of the conductive trace. The cap has a base portion and a sidewall. The sidewall extends outward from the base portion to define a recess in the cap. The sidewall of the cap is attached to at least the isolation layer. An isolation trench separates the cap and the conductive island. The isolation trench may be unfilled or at least partially filled with an electrically isolating material. The first end of the conductive trace is electrically attached to a microstructure within a hermetically sealed cavity of the microdevice. The second end of the conductive trace is electrically attached to the conductive island. The conductive island and the conductive trace provide an electrical connection to the microstructure within the hermetically sealed cavity.

There is also a method of making a microdevice having a hermetically sealed cavity to house a microstructure. The method may comprise the steps of: providing a substrate having a top side and a bottom side; forming a conductive trace on the top side of the substrate, the conductive trace having a first end and a second end; forming an isolation layer over at least a portion of the top side of the substrate and the conductive trace; forming a gap in the substrate; attaching a microstructure to the first end of the conductive trace so that at least a substantial portion of the microstructure is positioned above the gap; providing a silicon cap and a silicon island, the silicon cap being separated from the silicon island by an isolation trench; attaching the silicon cap to the isolation layer formed on the top side of the substrate such that the silicon cap houses the microstructure and forms the hermetically sealed cavity; and attaching the silicon island to the second end of the conductive trace.

The step of attaching the silicon cap to the isolation layer may include anodic bonding. The step of forming an isolation layer over at least a portion of the top side of the substrate may include depositing a glass layer on the top side of the substrate and planarizing and polishing an outer surface of the glass layer. In some embodiments, the method may further comprise the steps of: forming a single crystalline silicon getter layer in a recess of the silicon cap; and activating the getter layer such that the getter layer is capable of adsorbing vapor and gas species generated during the step of attaching the silicon cap to the isolation layer.

The method of making a microdevice having a hermetically sealed cavity to house a microstructure may also comprise the steps of: providing a substrate having a top side and a bottom side; forming a conductive trace on the top side of the substrate; forming an isolation layer over at least a portion of the top side of the substrate and the conductive trace; forming a first contact window and a second contact window in the isolation layer to allow electrical connection to a first end portion and a second end portion of the conductive trace; attaching a microstructure to the conductive trace through the first contact window; providing a silicon cap and a silicon island, the silicon cap being separated from the silicon island by an isolation trench; attaching the silicon cap to the isolation layer formed on the top side of the substrate such that the silicon cap houses the microstructure and forms the hermetically sealed cavity; and attaching the silicon island to the conductive trace through the second contact window. The step of attaching a microstructure to the conductive trace may further include the steps of forming at least a first metal contact over the first contact window so that the first metal contact is connected with the conductive trace and then attaching the microstructure to the first metal contact. The step of attaching the silicon island to the conductive trace may further include the steps of forming at least a second metal contact over the second contact window so that the second metal contact is connected with the conductive trace and then attaching the silicon island to the second metal contact.

Figure 2:
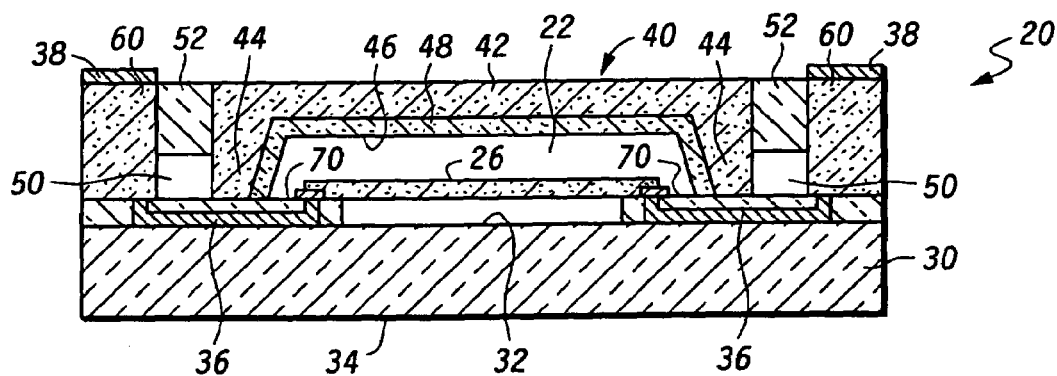
FIG. 2 is a cross-sectional view of the microdevice shown in FIG. 1 across the dashed line 2—2.

Turning to the drawings, FIGS. 1–2 show one embodiment of a microdevice 20 having a hermetically sealed cavity 22 at the wafer level. FIG. 1 shows the top view of the microdevice 20. FIG. 2 is a cross-sectional view of the microdevice 20 across the dashed line 2—2 shown in FIG. 1.

The microdevice 20 may be a sensor having a microstructure 26 attached to a substrate 30. Here, the microdevice 20 may be the type that can provide sensing capabilities. For example, a micro gyroscope senses angular rate. For purposes of illustration, the description and figures are shown in the context of a sensor. One of ordinary skill in the art with the benefit of this disclosure will recognize, however, that the present invention may apply to other applications.

In one embodiment of the present invention, as shown in FIGS. 1–2, the microdevice 20 has a hermetically sealed cavity 22 that houses a microstructure 26. The microdevice 20 may comprise a substrate 30, a cap 40, isolation trenches 50, conductive islands 60, and an isolation layer 70. The device microstructure 26 may be mounted within the hermetically sealed cavity 22 at various anchor points. This allows at least a major body portion of the microstructure 26 to be suspended within the microdevice 20. The microstructure may be a moving structure such as those used for a gyroscope or other microdevices.

The substrate 30 has a top side 32 and a bottom side 34. The substrate 30 may also have a set of conductive traces 36 formed on at least a portion of the top side 32 of the substrate 30. As will be illustrated, the set of conductive traces 36 in this design is the set of horizontal conductive feedthroughs that electrically connect the microstructure 26 within the cavity 22 to the outside environment. The conductive islands 60 may further have a set of conductive traces 38 formed as bond pads or electrical contacts to the outside of the microdevice 20. The set of conductive traces 38 provide electrical connection between the microstructure 26 and the outside environment through the set of conductive traces 36 and the conductive islands 60.

The cap 40 has a base portion 42 and a sidewall 44. The sidewall 44 extends outwardly from the base portion 42 and defines a recess 46 in the cap 40. The hermetically sealed cavity 22 is at least partially defined by the recess 46 in the cap 40. In one embodiment, the cap 40 is fabricated from a silicon wafer as described below.

Figure 3:
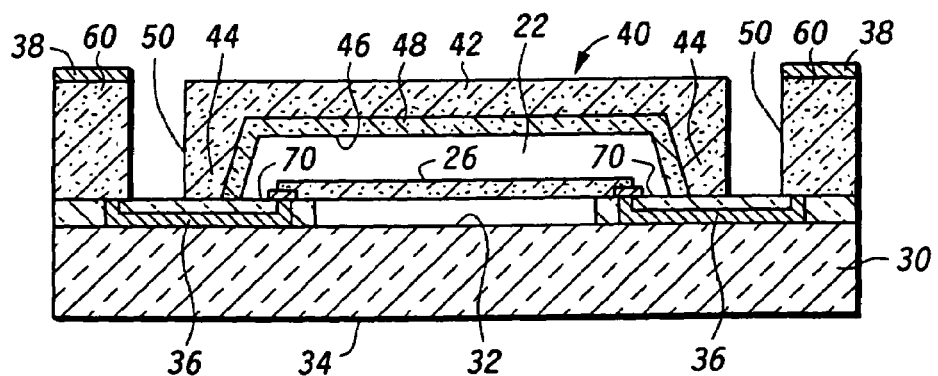
FIG. 3 is a cross-sectional view of another embodiment of a microdevice of the present invention.

As will be shown below, the conductive islands 60 may be fabricated from the same silicon wafer used to form the cap 40. However, the conductive islands 60 are separated from the cap 40 by the isolation trenches 50. Accordingly, the isolation trenches 50 are located between an exterior sidewall 44 of the cap 40 and the conductive islands 60. In one embodiment, as shown in FIG. 2, the isolation trenches 50 are at least partially filled with an electrically isolating material 52, such as a glass filler material. In another embodiment, as shown in FIG. 3, the isolation trenches 50 are open and unfilled. The conductive islands 60 provide electrical connection between the microstructure 26 and the outside environment through the set of conductive traces 36.

As will also be shown below, the isolation layers 70 are made of an electrically isolating material such as a glass filler material. The isolation layers 70, along with the isolation trenches 50, provide electrical isolation to avoid shorting between conductive traces 36 through the cap 40.

In a preferred embodiment, the cap 40 is attached to the isolation layer 70 through a non-adhesive type hermetical seal. For instance, the cap 40 and the isolation layer 70 may be attached together through an anodic bonding process in a vacuum. Here, the cap 40 is preferably made of silicon and the isolation layer 70 is preferably made of glass. The outer bonding surface of the isolation layer 70 should be planarized and polished. The anodic bonding process includes aligning and clamping the silicon cap 40 over the isolation layer 70, and applying a high voltage between them at an elevated temperature. At an elevated temperature and a high negative potential, the positive ions inside the glass drift away from the glass surface adjacent to the silicon into the bulk of the glass, and a high electric field is generated across the air gap between the glass isolation layer 70 and the silicon cap 40 due to the depletion of positive ions at the interface. The high electrostatic forces clamp two bonding surfaces very tightly to form a strong and uniform bond.

In one embodiment of the present invention, the cap 40 is made of silicon. If the cap 40 is made of silicon, the cap 40 may further have a single crystalline silicon getter layer 48 embedded along the recess 46. The getter layer 48 would be in a spaced-apart relationship from the device microstructure 26. The activated getter layer 48 helps maintain a vacuum within the cavity 22. An embedded single crystalline silicon getter layer 48 in the silicon cap 40 is preferred because it is able to adsorb many vapor and gas species generated during the sealing process and desorpted over the device's lifetime from the materials of the microdevice 20 such as the microstructure 26, substrate 30, and the sealing material in some embodiments.

The porous single crystalline silicon getter layer 48 can be advantageously formed into the silicon cap 40 using an electrochemical etching technique on a silicon wafer. The use of an electrochemical technique for this application is preferred because it allows more flexibility, repeatability, and control in the selection of pore size and pore distribution and porous layer thickness. In the electrochemical etching process, the silicon cap 40 (as part of a plurality of silicon caps on a wafer) may be placed into a HF solution. Depending on the application, the design shown in FIGS. 1–3 may only need one side of the silicon cap to have an embedded getter layer 48. Accordingly, another side of the wafer retaining the silicon caps 40 should be protected by an etching fixture or otherwise covered with a hard mask material during the porous formation process in the HF solution. In addition, the selective formation of the porous layer is enabled by forming and patterning a hard mask material on the recess side of the wafer that retains the silicon caps 40. In this way, a single crystalline silicon getter layer 48 is formed only along the recess 46 in the silicon cap 40. Selecting doping type and concentration, or porous formation parameters such as HF concentration and current density can advantageously alter the getter layer 48.

If a single crystalline silicon getter layer 48 is used, the getter layer 48 may be activated by different methods such as thermal, electrical or optical methods. For instance, thermal activation at elevated temperatures in a vacuum environment for an appropriate duration will remove hydrogen and other species from the porous silicon surface and make it active to vapor and gas species.

In a further alternative embodiment of the present invention, the single crystalline silicon getter layer 48 may be selectively doped with certain types of metallic materials such as Titanium (Ti), Palladium (Pd), Platinum (Pt), and Zirconium (Zr) to increase the silicon getter reactivity to certain species. The doping of the porous silicon can be done by either sputter or evaporation, or chemical deposition by soaking the porous silicon in aqueous solutions containing the required doping species.

In yet a further embodiment, a thin layer of silicon oxide may be kept on the surface of the single crystalline silicon getter layer 48 to increase the getter reactivity with certain types of gas or vapor molecules.

The benefit of using a single crystalline silicon getter layer 48 within recess 46 is that it allows a greater area ratio of active getter surface to outgassing surface than found in known prior art devices. Moreover, the other benefit of using the single crystalline silicon getter is that the exterior getter surface can be modified to further enhance the getter efficiency. For instance, application Ser. No. 10/260,675 entitled "Hermetically Sealed Microdevices Having a Single Crystalline Silicon Getter for Maintaining Vacuum" by Xiaoyi Ding, filed Sep. 30, 2002, commonly owned by the assignee of the present invention and incorporated herein by reference in its entirety, illustrates another design for a silicon cap having a single crystalline silicon getter layer that is corrugated along the bottom surface of a recess in the cap. As taught and explained in that application, the corrugation can be included into the wafer fabrication processing steps of the silicon cap. Alternatively, the getter side of the silicon wafer can be slightly etched with a low concentration KOH solution to rough the surface before porous formation.

Figure 7A:
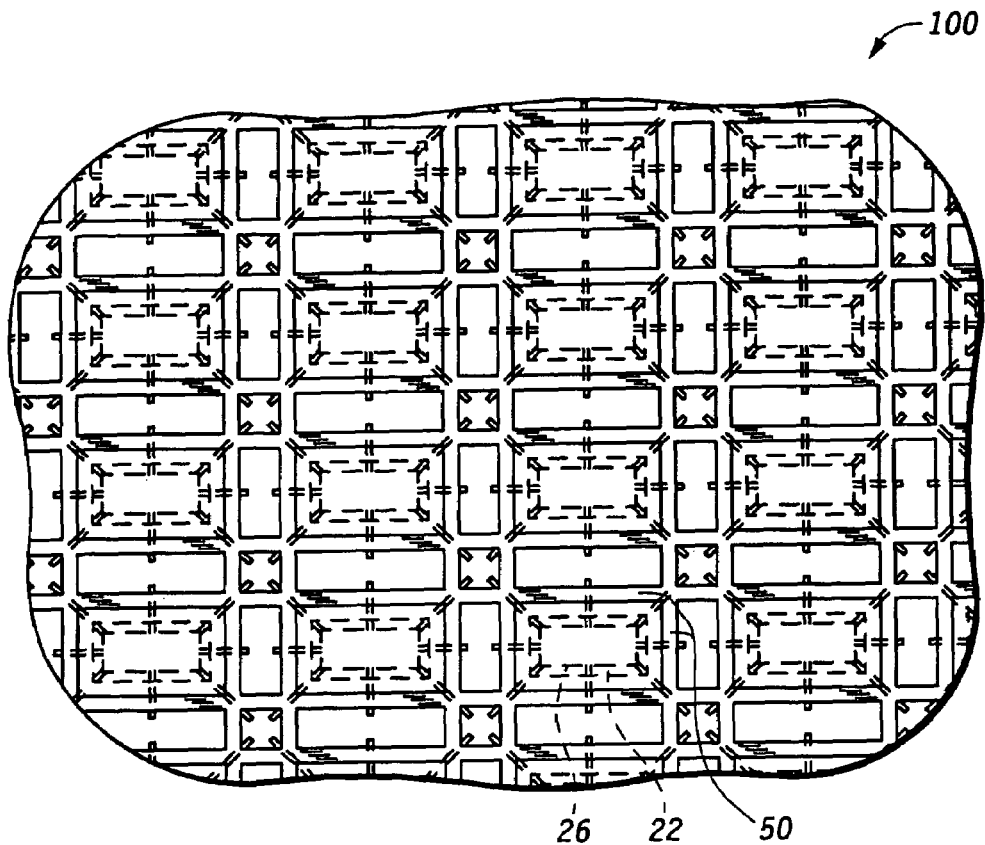
FIG. 7A is a top view of a portion of a wafer having a plurality of microdevices, each microdevice having the design as shown in FIGS. 1–2.
Figure 7B:
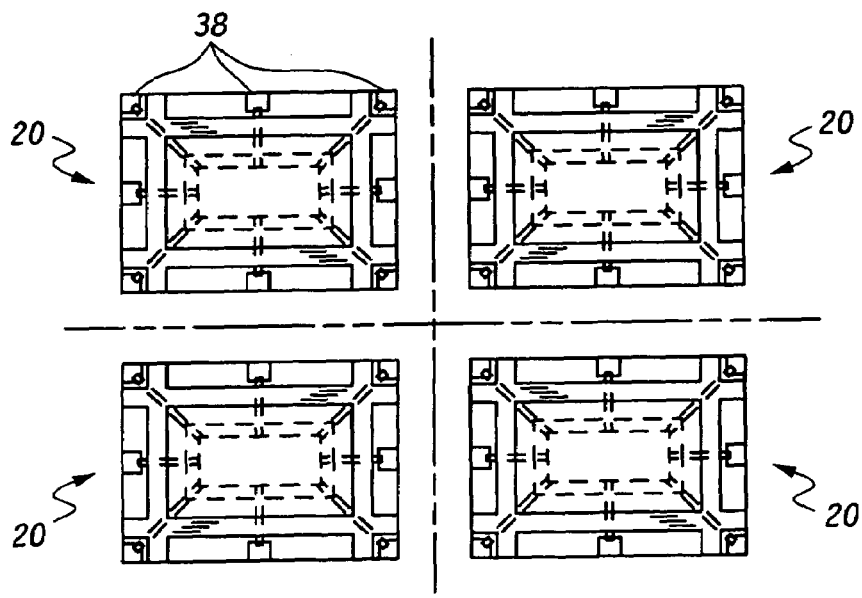
FIG. 7B is a top view of a plurality of microdevices after being separated from the wafer illustrated in FIG. 7A.

Now, processes for making microdevice 20 as shown in FIGS. 1–2 will be further explained. FIGS. 4A–4E illustrate methods of forming a plurality of substrates 30 with microstructures 26 and isolation layers 70 in a glass wafer 80. FIGS. 5A–5G illustrate methods of forming a plurality of caps 40, isolation trenches 50, and conductive islands 60 in a silicon wafer 90. FIGS. 6A–6D illustrate the steps of assembling the glass wafer 80 and the silicon wafer 90 (along with an assembled device 100) to form a plurality of microdevices 20. A top portion of the assembled wafers shown in FIG. 6C is illustrated in FIG. 7A. The assembled wafers may then be sawed or otherwise diced to form a plurality of microdevices 20 as illustrated in FIG. 7B.

Figure 4A:
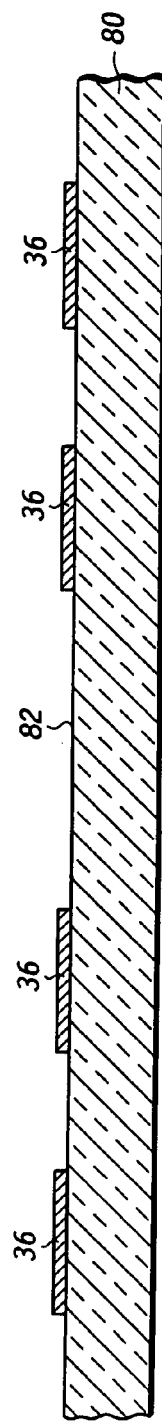
FIGS. 4A–4E are cross-sectional views of one embodiment of a method to form a substrate portion of the microdevice shown in FIGS. 1–3.

Turning initially to FIGS. 4A–4E, there is a method of forming a plurality of substrates 30 with microstructures 26 and isolation layers 70 from a glass wafer 80. Referring to FIG. 4A, a portion of a glass wafer 80 is shown having a top side 82 and a bottom side 84. The process includes the step of forming a set of conductive traces 36 on the top side 82 of the glass wafer 80. This can be accomplished by depositing and patterning lateral metal traces to the top side 82 of the glass wafer 80. As shown earlier, the set of conductive traces 36 will eventually be the horizontal conductive feedthroughs for the microdevice 20.

Figure 4B:
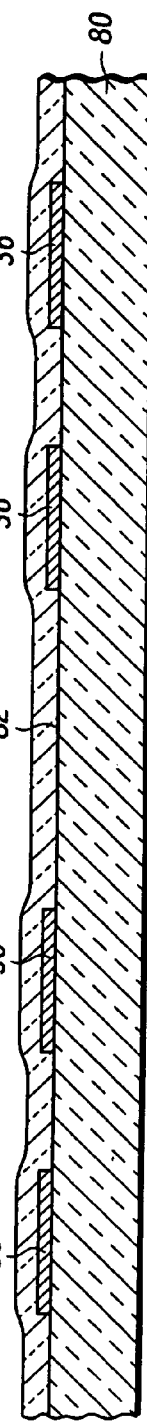
Figure 4C:
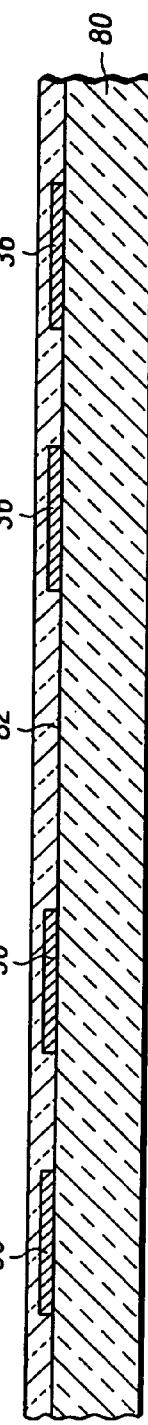

Referring to FIG. 4B, the next step in the process is to coat or deposit an isolation layer 70 over the top side 82 of the glass wafer 80, including over the conductive traces 36 formed thereon. A suitable material for the isolation layer 70 is a glass filler material. In particular, a glass filler material could be coated or deposited on the glass wafer 80 and then hardened through a curing step. If the isolation layer 70 is formed using a glass filler material (and then hardened), the process should also include a step to planarize and polish the top surface of the isolation layer 70 so that the hermetical seal can be done using silicon-to-glass anodic boding. This is illustrated in FIG. 4C. A suitable thickness of isolation layer 70 is about 3 to 5 μm.

Figure 4D:
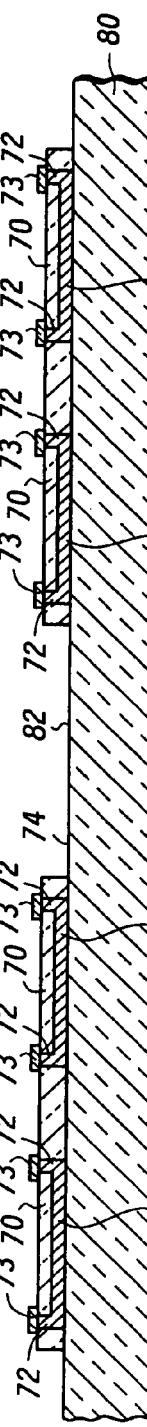

As shown in FIG. 4D, the process should then include a step of forming a plurality of contact windows 72 in the isolation layer 70 to expose the ends of each conductive trace 36, and then forming metal contacts 73. The metal contacts 73 may be used to electrically connect metal traces 36 to both conductive islands 60 and microstructure 26. The process of forming contact windows 72 also creates a gap 74 in the isolation layer 70 so that the microstructure 26 can be freestanding over the gap 74. If the isolation layer 70 is made of a glass material, the steps of forming the gap 74, and contact windows 72 could include patterning the isolation layer 70 with a masking layer and then performing either wet etching in a HF-based solution or dry etching such as reactive ion etch.

Figure 4E:
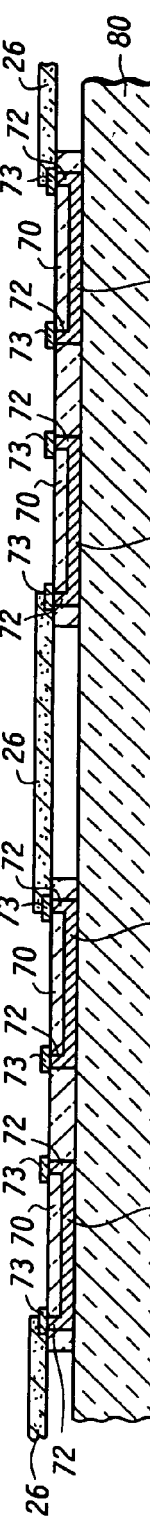

As shown in FIG. 4E, the process may also include forming or attaching the microstructure 26 on the wafer 80 to the metal traces 36 through one of the contact windows 72. This may be done by forming or attaching any electrodes of the microstructure 26 to the metal contacts 73 that are connected to the metal trace 36. Also, the microstructure 26 should be positioned such that moving portions of the microstructure 26 are freestanding over gap 74.

Now referring to FIGS. 5A–5G, there is a method of forming a plurality of caps 40, isolation trenches 50, and conductive islands 60 from a silicon wafer 90. Different doping types and crystalline orientations of the silicon wafer can be used. However, a P-type, (100) silicon wafer is chosen in the following explanation of the process for making the hermetically sealed microdevices having a getter layer 48 embedded in the silicon cap 40. Although the method taught here shows one way of forming a getter layer 48 in the cap 40, other techniques to form a getter layer within the recess 46 may be used. Additionally, FIGS. 5A–5G illustrate the formation of a silicon cap 40 having a relatively flat single crystalline silicon getter layer 48. The getter layer could also be corrugated similar to that taught and described in application Ser. No. 10/260,675 entitled "Hermetically Sealed Microdevices Having a Single Crystalline Silicon Getter for Maintaining Vacuum" by Xiaoyi Ding, filed Sep. 30, 2002.

Figure 5A:
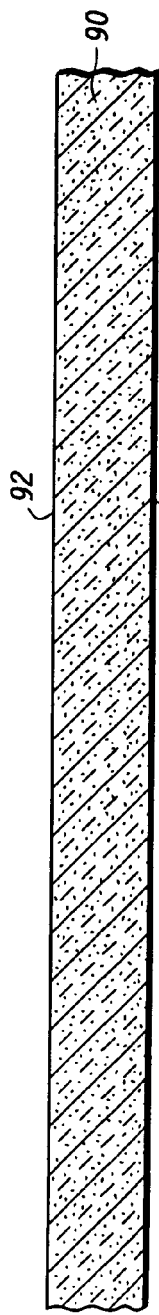
Figure 5B:
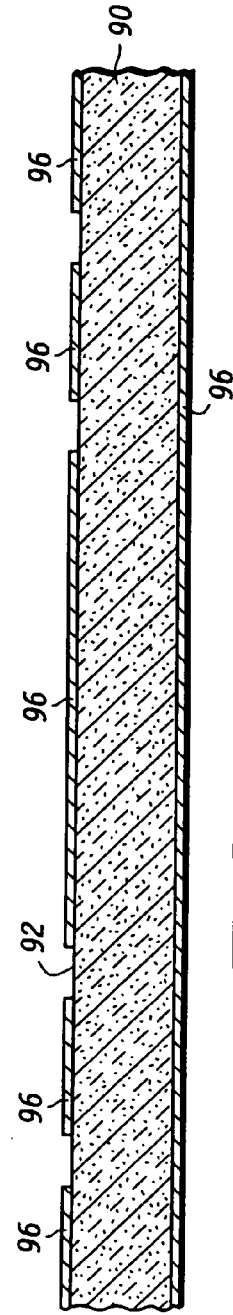
Figure 5C:
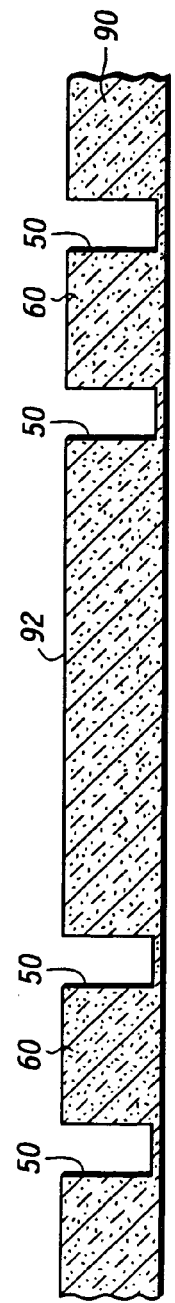

Referring to FIG. 5A, a portion of a silicon wafer 90 is shown having a first side 92 and a second side 94. The process includes the step of forming isolation trenches 50 on the first side 92 of the silicon wafer 90. The isolation trenches 50 may be formed using known micro machining methods. In one embodiment, as shown in FIGS. 5B, a masking material 96, for instance a composite layer of silicon dioxide and silicon nitride is formed and patterned before the etching of the isolation trenches 50. In FIG. 5C, the isolation trenches 50 may be formed in the first side 92 of the wafer 90 using techniques such as plasma etching by deep reactive ion etching (DRIE) or anisotropic wet chemical etching by potassium hydroxide (KOH), ethylenediamine pyrocatechol (EDP) or tetra methyl ammonium hydroxide (TMAH). The depth of the isolation trenches 50 is application specific but should depend on the desired thickness of the silicon cap 40. In one example, where the desired thickness of the silicon cap 40 is about 200 μm and the depth of the cap recess is about 100 μm, the etching depth of the trenches 50 is about 300 μm.

Figure 5D:
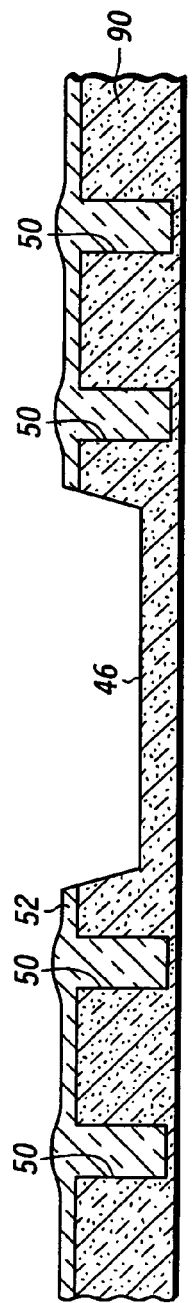

As shown in FIG. 5D, the process may further include coating or depositing an electrically isolating material 52 over the first side 92 of the silicon wafer 90, including over and within the isolation trenches 50 formed thereon. A suitable material for the electrically isolating material 52 is a glass filler material. In particular, a glass filler material could be coated or deposited on the silicon wafer 90 and then hardened through a curing step. Next, the recess 46 on the top side 92 of the wafer 90 may be formed by first patterning and etching the isolating material 52 to open a recess window. The recess 46 may then be formed using known etching techniques such as DRIE, EDP, KOH or TMAH. The depth of the recess 46 is application specific, and normally about 50 to 100 μm.

Figure 8:
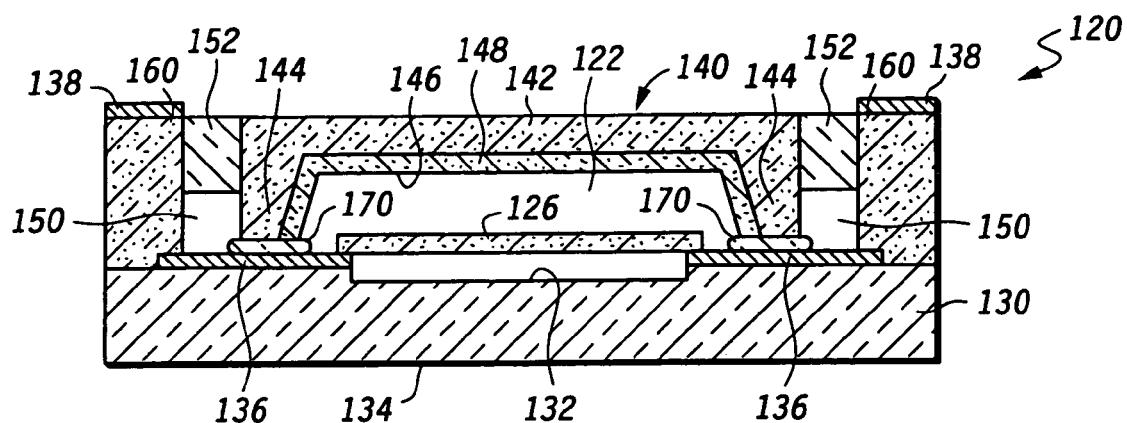
FIG. 8 is a cross-sectional view of another embodiment of a microdevice of the present invention.

FIG. 5E shows a completed cap wafer 90 that would be used to form the caps 40, 140 in FIGS. 2 and 8. Here, the isolation material 52 is completely removed from the top surface 92 of the cap wafer 90 but is still at least partially filled in the trenches 50. For the cap wafers 90 to be used in FIGS. 3 and 9, the isolation material 52 is completely removed from the cap wafer 90. As will be shown, the recesses 46 will be used to define at least a portion of the hermetically sealed cavity 22. It is noted that the isolation trenches 50 are located over the substrate wafer 80, but are not used to define portions of the hermetically sealed cavity 22.

Additional steps may be included in the fabrication process of the wafer 90 if one desires to form a single crystalline silicon getter layer 48 in recesses 46. As shown in FIG. 5F, a masking material 98 is created and patterned on the first side 92 for selective formation of the getter layer 48 on recesses 46. Additionally, the masking material on the second side 94 of the wafer 90 should be completely removed and replaced with a thin metal layer 99 that is deposited on the second side 94 of the silicon wafer 90. The thin metal layer 99 will provide a uniform conductance across the silicon wafer 90 during the porous formation step. A suitable thin metal layer 99 in one embodiment is about 1 μm thick aluminum.

The step of forming a single crystalline silicon getter layer 48 in the recesses 46 is illustrated in FIG. 5F. As mentioned above, the getter layer 48 may be formed by performing the electrochemical etching in a HF solution. The use of an electrochemical technique for this application is preferred over depositing techniques because it allows more flexibility, repeatability, and control in the selection of pore size, pore distribution, and porous layer thickness. The thickness of the getter layer 48 is application specific and depends on the size of the cavity and amount of gas molecules to be adsorbed over the device lifetime. In one application having a design similar to that shown in FIGS. 1–3, the volume of the internal cavity 22 was about $9 \times 10^{-4}$ cm$^3$ and the internal surface area of both the silicon cap 40 and the substrate 30 was about $2 \times 10^{-5}$ cm$^2$. A suitable porous silicon getter layer 48 was selected to have a volume of about $1.8 \times 10^{-3}$ cm$^3$ along the recess 46. This provides an advantageous larger ratio of active getter surface area to out gassing surface area than known prior art devices. After a getter layer 48 is formed in the wafer 90, the masking material 98 and the metal layer 99 on wafer 90 are removed as shown in FIG. 5G.

The next step, as shown in FIGS. 6A–6D, is to hermetically seal the glass wafer 80 (having a plurality of device substrates) with the silicon wafer 90 (having a plurality of caps 40). As shown in FIG. 6A, the assembly process includes a step of aligning the glass wafer 80 with silicon wafer 90 in such a way that the recesses 46 will be on top of the corresponding microstructure 26. Initially, a small gap should exist between the silicon wafer 90 and the glass wafer 80. The wafer assembly is then subjected to a vacuum and an elevated temperature. This allows for an initial degassing of the materials included in the microdevice.

If the microdevice 20 includes a getter layer 48, the process would then further include a step of activating the getter layer 48. As mentioned above, in one embodiment, the getter layer 48 is activated through a thermal, electrical, or optical process to remove hydrogen and other species from the silicon getter surface. This frees the dangling bonds on the silicon getter surface to act as reactive units for adsorbing vapor and gas species. In one embodiment, the activation step may be performed just prior to or during the bonding of the silicon wafer 90 to the glass wafer 80.

Referring to FIG. 6B, the process includes the step of bonding the silicon wafer 90 to the glass wafer 80 in a vacuum environment by using a technique such as an anodic bonding technique as described in more detail above. The bonding of the silicon wafer 90 to the glass wafer 80 creates an assembled wafer 100.

Referring to FIG. 6C, the process further includes removing a portion of the second side 94 of the silicon wafer 90 such that the isolation trenches 50 are exposed. In one embodiment, as shown in FIGS. 2 and 6C, the isolation trenches 50 are filled with an electrical isolating material 52. In another embodiment, as shown in FIG. 3, the isolation trenches 50 are opened and unfilled.

Finally, as illustrated in FIG. 6D, the next step in the process is to deposit and pattern the metal bond pads 38 over the conductive islands 60. Then the assembled wafer 100 is diced into individual microdevices 20. For some applications, the metal contact layer 38 can also be deposited and patterned on the outer wall of the conductive island 60, which is not shown in FIG. 6D.

One advantage of this design is that the isolation trenches do not need to be hermetically sealed because they are outside of the vacuum cavity 22. In this case, the cracks and other defects inside or on the trenches will not affect the vacuum integrity of the cavity 22. Another advantage is that this design allows a small die size compared with other designs having isolation trenches inside the vacuum cavity. This design also offers the flexibility of minimizing stray capacitance between adjacent conductive islands by completely removing the isolation material 52 from the isolation trench 50.

Figure 9:
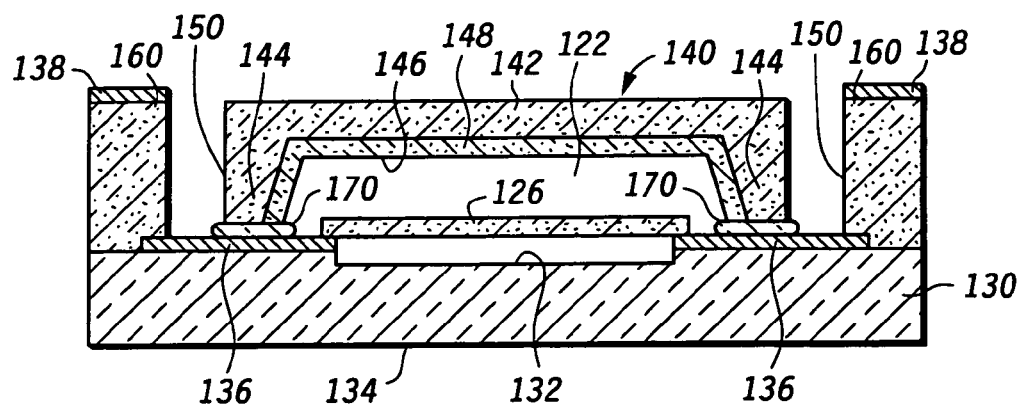
FIG. 9 is a cross-sectional view of a further embodiment of a microdevice of the present invention.

Referring to FIGS. 8–9, in another embodiment of the present invention, there is a microdevice 120 having a hermetically sealed cavity 122 at the wafer level. FIG. 8 shows a cross-sectional view of one embodiment of a microdevice 120. As seen here, the horizontal conductive feedthroughs 136 in this embodiment also extend on the substrate 130 and terminate at a point within the hermetically sealed cavity 122.

In this embodiment, the microdevice 120 may also be a sensor having a microstructure 126 attached to the substrate 130. The microdevice 120 may comprise a substrate 130, a cap 140, isolation trenches 150, conductive islands 160, and isolation layers 170. The device microstructure 126 may be mounted within the hermetically sealed cavity 122 at various anchor points. This allows at least a major body portion of the microstructure 126 to be suspended within the microdevice 120. The microstructure may be a moving structure such as those used for a gyroscope or other microdevices.

The substrate 130 has a top side 132 and a bottom side 134. The substrate 130 may also have a first set of conductive traces 136 formed on at least a portion of the top side 132 of the substrate 130. The microdevice 120 further has a second set of conductive traces 138 formed on an exterior corner of the conductive islands 160. As shown in FIG. 8, the isolation trenches 150 may further be filled with an electrical isolating material 152.

An advantage of the embodiment shown in FIGS. 8 and 9 over the embodiment shown in FIGS. 2 and 3 is that it eliminates the need of coating the glass filler material over the entire conductive traces, polishing the glass filler material, and opening and metalizing the contact windows over the glass filler material. In this embodiment, the cap 140 is attached to the substrate 130 through a frit glass bonding, and the conductive islands 160 are attached to the substrate 130 through an anodic bonding. Both the frit glass bonding and anodic bonding for attaching the cap 140 and conductive islands 160 to the substrate 130 are accomplished in a same process step.

The method of forming a plurality of substrates 130 from a glass wafer used in the embodiment shown in FIGS. 8 and 9 is simpler than that taught in FIGS. 4A–4E used in the embodiment shown in FIGS. 2 and 3 because no process steps are needed for forming the isolation layer over the entire conductive traces, polishing the isolation layer, and opening and metalizing the contact windows on the isolation layer. The method of forming a plurality of caps 140, isolation trenches 150, and conductive islands 160 from a silicon wafer used in the embodiment shown in FIGS. 8 and 9 is similar to that taught in FIGS. 5A–5G except to add the process steps to etch down the bonding surface of the sidewall 144 of the cap 140 to certain depth. This etching depth should be slightly less than the thickness of as-deposited frit glass layer 170. A typical range of this etching depth is about 5 to 20 microns.

The assembling method used for the embodiment shown in FIGS. 8 and 9 is unique to have both frit glass bond and anodic bond achieved in a same process step. A frit glass layer 170 can be deposited on either the bonding surface of the substrate 130 or the bonding surface of the sidewall 144 of the cap 140. The pre-etched depth on the bonding surface of the sidewall 144 of the cap 140 ensures an optimum and uniform final frit glass thickness across the wafer. After deposition of the frit glass layer 170, the cap wafer and substrate wafer are aligned and degassed in a vacuum and an elevated temperature. Then the two wafers are clamped together such that the cavity 122 is housing the microstructure 126, and bonding surfaces of the conductive islands 160 and the substrate 130 contact to each other. The assembly is maintained in vacuum and heated to a melting temperature of the frit glass, and then subjected to an anodic bonding voltage with the conductive islands 160 in positive potential. Pressure and voltage are continuously applied to maintain contact between bonding surfaces of sidewall 144 of the cap 140 and the substrate 130 until both frit glass bond and anodic bond are completed. The anodic bond makes the electrical contacts between the conductive islands 160 and the conductive traces 136, and the frit glass bond forms a hermetic seal between the cap 140 and the substrate 130.

FIG. 9 shows a cross-sectional view of another embodiment of a microdevice 120. The microdevice 120 is similar to that shown in FIG. 8 but its isolation trenches 50 are not filled with an electrical isolating material 152.

What has been described is a new microdevice and method of making a microdevice having isolation trenches and conductive feedthroughs for electrically connecting a microstructure sealed in a vacuum cavity to the outside environment. The present invention, in one embodiment, provides a better method of sealing a microstructure in wafer level by locating any vertical conductive paths outside the cavity. The formation of vertical paths outside of the cavity makes the device more reliable because cracks or other defects in the paths will not disrupt the hermetically sealed cavity. The embodiments taught herein have the added benefit of permitting the incorporation of efficient getter layers within the cavity that houses the microstructure. Further, the present invention significantly reduces the cost of making a vacuum-sealed microdevice by using low cost materials and processes. This is especially important to high volume applications.

The above description of the present invention is intended to be exemplary only and is not intended to limit the scope of any patent issuing from this application. The present invention is intended to be limited only by the scope and spirit of the following claims.

What is claimed is:

1. A microdevice having a hermetically sealed cavity to house a microstructure, the microdevice comprising:
  a substrate having a top side, the substrate having a plurality of conductive traces formed on at least a portion of its top side, the conductive traces providing electrical connection to the microstructure;
  a conductive cap having a base portion and a sidewall, the sidewall extending outwardly from the base portion to define a recess in the cap;
  an isolation layer attached between at least the sidewall of the cap and the plurality of conductive traces formed on the top side of the substrate, wherein the isolation layer electrically isolates the cap from the rest of the microdevice;
  at least one conductive island attached to the substrate and at least one of the plurality of conductive traces; and
  an isolation trench between the cap and the at least one conductive island;
  wherein the microstructure is mounted onto the isolation layer within the hermetically sealed cavity, the hermetically sealed cavity being at least partially defined by the recess in the cap, wherein the conductive island is electrically connected to the microstructure through the conductive traces.

2. The microdevice of claim 1 wherein the isolation trench is at least partially filled with a glass filler material.

3. The microdevice of claim 1 wherein the cap and the conductive island are made of silicon.

4. The microdevice of claim 3 wherein the cap has a single crystalline silicon getter layer embedded along the recess for maintaining a vacuum within the cavity.

5. The microdevice of claim 4 wherein the embedded single crystalline silicon getter layer is corrugated along at least a bottom surface of the recess of the cap.

6. The microdevice of claim 4 wherein the embedded single crystalline silicon getter layer is activated to adsorb vapor and gas species generated during a sealing process and outgassed from at least the substrate.

7. The microdevice of claim 1 wherein the isolation layer is made of a glass filler material, the isolation layer attached to the sidewall of the cap by anodic bonding.

8. The microdevice of claim 1 wherein the microdevice is a gyroscope-sensing element.

9. The microdevice of claim 1 wherein a metallic contact is formed on the at least one conductive island.

10. The microdevice of claim 1 wherein a height of the sidewall of the cap is less than a height of the conductive island.

11. A microdevice having a hermetically sealed cavity to house a microstructure, the microdevice comprising:
  a substrate having a top side, the substrate having at least one conductive trace with a first end and a second end, the first end of the conductive trace electrically attached to the microstructure;
  an isolation layer around at least a portion of the conductive trace;
  a conductive cap having a base portion and a sidewall, the sidewall extending outwardly from the base portion to define a recess in the cape the sidewall attached to at least the isolation layer, wherein the isolation layer electrically isolates the cap from the rest of the microdevice; and
  a conductive island electrically attached to the second end of the conductive truce, the conductive island separated from the cap by an isolation trench;
  wherein the microstructure is mounted onto the isolation layer within the hermetically sealed cavity, the hermetically sealed cavity being at least partially defined by the recess in the cap, the conductive island and conductive trace providing an electrical connection to the microstructure within the hermetically sealed cavity.

12. The microdevice of claim 11 wherein the isolation trench is at least partially filled with a glass filler material.

13. The microdevice of claim 11 wherein the cap and the conductive island are made of silicon.

14. The microdevice of claim 13 wherein the cap has a single crystalline silicon getter layer embedded along the recess for maintaining a vacuum within the cavity.

15. The microdevice of claim 14 wherein the embedded single crystalline silicon getter layer is corrugated along at least a bottom surface of the recess of the cap.

16. The microdevice of claim 14 wherein the embedded single crystalline silicon getter layer is activated to adsorb vapor and gas species generated during a sealing process and outgassed from at least the substrate.

17. The microdevice of claim 13 wherein the isolation layer is made of a glass filler material, the isolation layer attached to the sidewall of the cap by anodic bonding.

18. The microdevice of claim 11 wherein the microdevice is a gyroscope-sensing element.

19. The microdevice of claim 11 wherein a metallic contact is formed on an exterior surface of the conductive island.

20. The microdevice of claim 11 wherein a height of the sidewall of the cap is less than a height of the conductive island.

* * * * *